(12) United States Patent
Landis et al.

(10) Patent No.: US 11,415,881 B2
(45) Date of Patent: Aug. 16, 2022

(54) METHOD FOR FUNCTIONALISING A SUBSTRATE

(71) Applicant: COMMISSARIAT A L'ENERGIE ATOMIQUE ET AUX ENERGIES ALTERNATIVES, Paris (FR)

(72) Inventors: Stefan Landis, Tullins (FR); Raluca Tiron, Saint-Martin-le-Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 371 days.

(21) Appl. No.: 16/469,897

(22) PCT Filed: Dec. 7, 2017

(86) PCT No.: PCT/EP2017/081908
§ 371 (c)(1),
(2) Date: Jun. 14, 2019

(87) PCT Pub. No.: WO2018/108708
PCT Pub. Date: Jun. 21, 2018

(65) Prior Publication Data
US 2019/0317400 A1 Oct. 17, 2019

(30) Foreign Application Priority Data
Dec. 16, 2016 (FR) ...................................... 1662677

(51) Int. Cl.
*G03F 7/00* (2006.01)
(52) U.S. Cl.
CPC .................. *G03F 7/0002* (2013.01)
(58) Field of Classification Search
CPC ................................................... G03F 7/0002
See application file for complete search history.

(56) References Cited

U.S. PATENT DOCUMENTS

| 9,129,812 B2 | 9/2015 | Geo et al. |
| 2006/0046069 A1 | 3/2006 | Jung et al. |

(Continued)

FOREIGN PATENT DOCUMENTS

| EP | 1 576 420 A1 | 9/2005 |
| JP | 2008-306066 A | 12/2008 |

(Continued)

OTHER PUBLICATIONS

Madhusha, Difference Between Oligomer and Polymer, PEDIAA, https://pediaa.com/difference-between-oligomer-and-polymer/, Sep. 10, 2017.*

(Continued)

*Primary Examiner* — James M Mellott
(74) *Attorney, Agent, or Firm* — Pillsbury Winthrop Shaw Pittman LLP

(57) ABSTRACT

A method for functionalising a substrate intended for the self-assembly of a block copolymer, includes depositing on the surface of a substrate a layer of a first polymer material, the first polymer having a first chemical affinity with respect to the block copolymer; grafting one part only of the first polymer material layer onto the surface of the substrate; printing, using a mould, patterns in a sacrificial layer arranged above the grafted part of the first polymer material layer; transferring the patterns of the sacrificial layer into the grafted part of the first polymer material layer, until the substrate is reached; and removing at least one part of the sacrificial layer by wet etching, so as to uncover the grafted part of the first polymer material layer.

12 Claims, 4 Drawing Sheets

(56) References Cited

U.S. PATENT DOCUMENTS

| | | | |
|---|---|---|---|
| 2008/0176767 A1* | 7/2008 | Millward | H05B 3/145 |
| | | | 506/20 |
| 2008/0193658 A1* | 8/2008 | Millward | B81C 1/00031 |
| | | | 427/401 |
| 2009/0308837 A1* | 12/2009 | Albrecht | G11B 5/855 |
| | | | 216/22 |
| 2010/0159214 A1 | 6/2010 | Hasegawa et al. | |
| 2012/0135159 A1 | 5/2012 | Xiao et al. | |
| 2012/0196089 A1* | 8/2012 | Yang | B81C 1/00031 |
| | | | 428/156 |
| 2014/0072722 A1 | 3/2014 | Kawanishi et al. | |
| 2016/0237307 A1* | 8/2016 | Cheng | C08F 214/182 |

FOREIGN PATENT DOCUMENTS

| | | |
|---|---|---|
| JP | 2010-144120 A | 7/2010 |
| JP | 2011-067950 A | 4/2011 |
| JP | 2013-067084 A | 4/2013 |
| JP | 2014-053558 A | 3/2014 |
| WO | WO 2004/059386 A1 | 7/2004 |
| WO | WO 2012/163702 A1 | 12/2012 |

OTHER PUBLICATIONS

International Search Report as issued in International Patent Application No. PCT/EP2017/081908, dated Feb. 7, 2018.
Search Report as issued in French Patent Application No. 1662677, dated Aug. 29, 2017.
Oria, L., et al., "Guided self-assembly of block-copolymer for CMOS technology: a comparative study between grapho-epitaxy and surface chemical modification," SPIE (2011), vol. 7970-24, 7 pages.
Chevalier, X., et al. "Study and optimization of the parameters governing the block copolymer self-assembly: toward a future integration in lithographic process," SPIE (2011), 11 pages.
Tiron, R., et al. "Template affinity role in CH shrink by DSA planarization," SPIE (2011), vol. 9423, 12 pages.
First Office Action as issued in Japanese Patent Application No. 2019-532118, dated Sep. 14, 2021.

* cited by examiner

METHOD FOR FUNCTIONALISING A SUBSTRATE

CROSS REFERENCE TO RELATED APPLICATIONS

This application is the U.S. National Stage of PCT/EP2017/081908, filed Dec. 7, 2017, which in turn claims priority to French Patent Application No. 1662677 filed Dec. 16, 2016, the entire contents of all applications are incorporated herein by reference in their entireties.

TECHNICAL FIELD

The present invention relates to method for functionalising a substrate intended for the self-assembly of a block copolymer. The present invention also relates to a chemo-epitaxy method from a substrate functionalised by means of the functionalisation method.

PRIOR ART

DSA, or directed self-assembly, of block copolymers is an emerging lithography technique making it possible to form patterns of critical dimension below 30 nm. This technique constitutes a less costly alternative to extreme ultraviolet (EUV) lithography and e-beam lithography.

Known methods of self-assembly of block copolymers may be grouped together into two categories, grapho-epitaxy and chemo-epitaxy, both of which are described in detail in the article ["Guided self-assembly of block-copolymer for CMOS technology: a comparative study between grapho-epitaxy and surface chemical modification", L. Oria et al., SPIE 2011, Vol. 7970-24].

Grapho-epitaxy consists in forming primary topographic patterns called guides on the surface of a substrate, these patterns delimiting areas inside which a block copolymer layer is deposited. The guiding patterns make it possible to control the organisation of the blocks of copolymer to form secondary patterns of greater resolution inside these areas. The guiding patterns are conventionally formed by photo-lithography in a resin layer and, optionally, transferred into a hard mask.

Chemo-epitaxy consists in modifying the chemical properties of certain portions of the substrate, in order to force the organisation of the blocks of copolymer between these portions. The chemical modification of the substrate may notably be obtained by the grafting of a polymer functionalisation layer. Then, this functionalisation layer is patterned in order to create a chemical contrast on the surface of the substrate. The bare portions of the substrate will thus have a first chemical affinity with respect to the blocks of the copolymer, whereas the portions of the substrate covered by the functionalisation layer will have a second chemical affinity, different from the first chemical affinity. The patterning of the functionalisation layer is conventionally obtained by a step of optical or e-beam lithography.

The document US2012/0135159 describes another method for functionalising a substrate, by means of a printable resin. A resin layer having a preferential affinity for one of the blocks of the copolymer is deposited on a substrate. This resin layer is next printed using a mould, so as to obtain a topographic contrast actually within the resin layer. During printing, the resin is cross-linked, either by heating the mould, or by exposure to ultraviolet rays through the mould. Then, the printed resin is treated chemically, by exposure to an oxygen plasma, in such a way as to expose the substrate in the printed patterns. This treatment step equates to thinning the layer of cross-linked resin to attain a thickness below 10 nm. The thinned resin layer next serves as functionalisation layer in a chemo-epitaxy method.

The thermal printing or UV-enhanced printing implemented in the functionalisation method of the document US2012/0135159 is an alternative technique to e-beam lithography for patterning the functionalisation layer. It avoids the appearance of defects, due to the superimposition of the resin to print (i.e. the polymer of the functionalisation layer) and an electron-sensitive (i.e. sensitive to the e-beam) resin. However, the step of chemical treatment of the printed resin—by means of a plasma—has the effect of damaging the surface of the functionalisation layer (on which the block copolymer is deposited) and of modifying its chemical affinity. The result is that the chemical affinity in the areas of the substrate covered by the functionalisation layer is difficult to control with such a method.

SUMMARY OF THE INVENTION

There thus exists a need to provide a method for functionalising a substrate that does not damage the functionalisation layer, or modify its chemical affinity, in order to guarantee good lithographic properties to the later method for self-assembling a block copolymer.

According to the invention, this need tends to be satisfied by providing the following steps:
- depositing on the surface of a substrate a layer of a first polymer material, the first polymer material having a first chemical affinity with respect to the block copolymer;
- grafting one part only of the first polymer material layer onto the surface of the substrate;
- printing, using a mould, patterns in a sacrificial layer arranged above the grafted part of the first polymer material layer;
- transferring the patterns of the sacrificial layer into the grafted part of the first polymer material layer, until the substrate is reached; and
- removing at least one part of the sacrificial layer by wet etching, so as to uncover the grafted part of the first polymer material layer.

Thus, in this functionalisation method, the grafted part of the polymer layer constitutes a functionalisation layer, which is patterned by transfer of the patterns printed beforehand into the sacrificial layer. This sacrificial layer makes it possible to protect the useful parts of the functionalisation layer—that is to say the parts on which the block copolymer will be deposited—during the patterning of the functionalisation layer. Indeed, the useful parts of the functionalisation layer are covered by the sacrificial layer during the step of transfer of the printed patterns. After this transfer, the removal of the sacrificial layer is carried out by a wet etching method, in order not to damage the underlying functionalisation layer or alter its chemical properties.

The functionalisation method according to the invention thus makes it possible to obtain a patterned functionalisation layer on the surface of the substrate, having the desired chemical affinity as well as a good surface condition. Conversely, in the method of the prior art, the surface of the functionalisation layer (comprised of a printed then thinned resin) is exposed to an oxygen plasma which creates surface defects and modifies its chemical affinity in an uncontrolled manner.

In a first embodiment of the functionalisation method according to the invention, the sacrificial layer is comprised of a non-grafted part of the first polymer material layer.

In a second embodiment of the functionalisation method, the sacrificial layer is comprised of a printable polymer material distinct from the first polymer material. The method then advantageously comprises a step consisting in removing a non-grafted part of the first polymer material layer, then in depositing the sacrificial layer made of printable polymer material on the grafted part of the first polymer material layer.

In a third embodiment of the functionalisation method, the sacrificial layer comprises a first sub-layer comprised of a non-grafted part of the first polymer material layer and a second sub-layer made of a printable polymer material distinct from the first polymer material, said at least one part of the sacrificial layer removed by wet etching corresponding to the first sub-layer. The method then advantageously comprises a step of depositing the sacrificial layer made of printable polymer material on the non-grafted part of the first polymer material layer.

Preferably, the printable polymer material is a thermoplastic resin, a thermosetting resin or a photo-polymerisable resin.

According to a development of the functionalisation method, the substrate comprises a superficial layer made of a second polymer material having a second chemical affinity with respect to the block copolymer and the patterns of the sacrificial layer are further transferred into the superficial layer.

The method according to the invention may also have one or more of the characteristics below, considered individually or according to all technically possible combinations thereof:
  said at least one part of the sacrificial layer is removed by means of a solvent;
  the first polymer material is neutral with respect to the blocks of the block copolymer;
  the second polymer material has a preferential affinity for one of the blocks of the block copolymer;
  the first polymer material layer is formed of a random copolymer, a homopolymer or a self-assembled monolayer;
  the patterns are printed in the sacrificial layer by thermal printing or by UV-enhanced printing; and
  the grafting of the first polymer material layer onto the surface of the substrate is carried out at the same time as the printing of the patterns.

The invention also relates to a chemo-epitaxy method comprising the preparation of a substrate functionalised using the functionalisation method described above, the deposition of a block copolymer on the surface of the functionalised substrate and the assembly of the block copolymer.

BRIEF DESCRIPTION OF THE FIGURES

Other characteristics and advantages of the invention will become clear from the description that is given thereof below, as an indication and in no way limiting, with reference to the appended figures, among which.

For greater clarity, identical or similar elements are marked by identical reference signs in all of the figures.

DETAILED DESCRIPTION OF AT LEAST ONE EMBODIMENT

The functionalisation method, which is the object of the invention, has the objective of creating a chemical contrast on the surface of a substrate, by means of a functionalisation layer covering one or more areas of the substrate. The remaining areas of the substrate may be left bare, in which case the substrate has a chemical affinity different from that of the functionalisation layer. The chemical contrast may also be obtained by arranging side by side on the surface of the substrate functionalisation layers having different chemical affinities.

This functionalised substrate is intended to be covered with a block copolymer, within the scope of a method for self-assembly a block copolymer. The chemical contrast makes it possible to force the organisation of the blocks of monomer which compose the copolymer. Thus, the chemical affinities of the substrate and the functionalisation layer(s) are meant with respect to the blocks of the copolymer. These affinities may be selected from the following possibilities:
  preferential affinity for any of the blocks of the copolymer; or
  neutral, that is to say without preference for any of the blocks of the copolymer.

FIGS. 1A to 1E represent the steps S11 to S15 of a method for functionalising a substrate 100, according to a first embodiment of the invention.

Figure 1A:
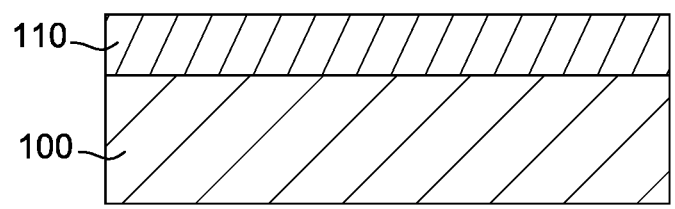
FIGS. 1A to 1E represent the steps of a functionalisation method according to a first embodiment of the invention.

The first step S11, illustrated by FIG. 1A, consists in depositing on the surface of the substrate 100 a layer of a polymer material 110, called functionalisation polymer. This functionalisation polymer 110 is graftable and selected according to the chemical affinity that it is wished to give to certain areas of the substrate 100. Moreover, in this first embodiment, the functionalisation polymer 110 is printable, that is to say that it is capable of being patterned, or modelled, via a printing method.

The functionalisation polymer 110 is preferably a random copolymer, a homopolymer or any other type of graftable (and printable) polymer allowing the surface energy to be controlled (the surface energy determines the chemical affinity with respect to the blocks of the copolymer). The polymer layer 110 may also be formed of a Self-Assembled Monolayer (SAM).

Preferably, the functionalisation polymer 110 is neutral with respect to the blocks of the copolymer. In other words, the interaction forces between each of the blocks of the copolymer and the functionalisation polymer 110 are equivalent. As an example, when the block copolymer intended to cover the functionalised substrate is PS-b-PMMA of cylindrical morphology, the functionalisation polymer 110 may be the random copolymer PS-r-PMMA comprising 70% by weight of polystyrene (PS) and 30% by weight of polymethylmethacrylate (PMMA). When the block copolymer is PS-b-PMMA of lamellar morphology, the functionalisation polymer 110 may be PS-r-PMMA comprising 50% by weight of PS and 50% by weight of PMMA.

The deposition of the functionalisation polymer 110 on the substrate 100 is advantageously carried out by spin coating. The functionalisation polymer 110 is diluted in a solvent to form a solution and this solution is spread on the substrate 100, by centrifugal force. For example, when the functionalisation polymer 110 is PS-r-PMMA, the solvent may be propylene glycol monomethyl ether acetate (PGMEA) and the solution may have a concentration by weight of polymer of around 1.5%. After deposition, the layer of polymer 110 in solution generally has a thickness comprised between 5 nm and 100 nm, and preferably between 10 nm and 50 nm. Such a thickness makes it possible to disperse the polymer over the entire surface of the substrate.

Other modes of deposition of the functionalisation polymer 110 may be envisaged, for example spray coating, drop dispensing, blade coating and chemical vapour deposition.

Figure 1B:
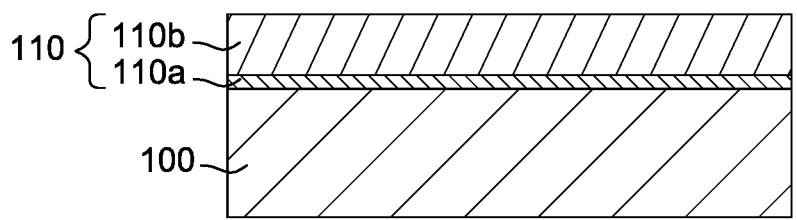

Then, at step S12 of FIG. 1B, a part 110a of the polymer layer 110 is grafted onto the surface of the substrate 100. This grafting may be carried out by annealing. Indeed, by heating the polymer layer 110 deposited on the substrate 100, covalent bonds form between a part of the polymer chains and the surface of the substrate. These polymer chains are then intimately bound to the substrate 100. The polymer chains not bound by covalent bonds to the substrate are contained in a non-grafted part 110b of the polymer layer 110, arranged above the grafted part 110a. The annealing is for example carried out at a temperature of 250° C. for a duration of around 10 minutes, by placing the substrate in a furnace or on a heating table. The solvent is evaporated before or during the grafting annealing. The thickness of the grafted part 110a of the polymer layer 110 is comprised between 1 nm and 15 nm. It is typically of the order of 5 nm.

Figure 1C:
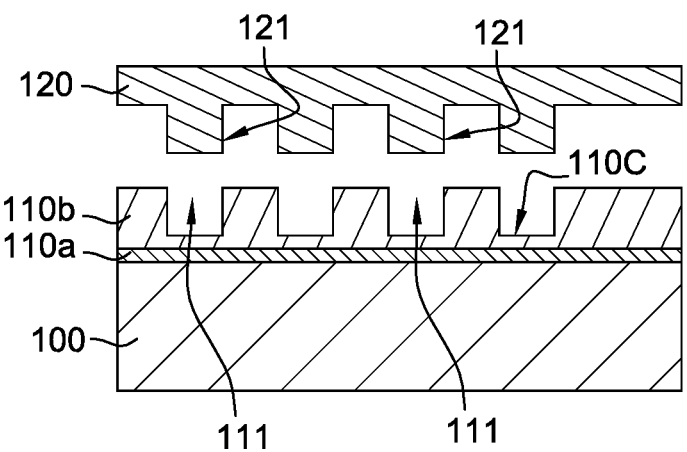

With reference to FIG. 1C, the functionalisation method next comprises a step S13 of printing recessed patterns 111 in the non-grafted part 110b of the polymer layer 110. A mould 120 comprising topographic (i.e. protruding) patterns 121 is pressed against the substrate 100 covered with the polymer layer 110, and more particularly against the non-grafted part 110b of the polymer layer 110. Each recessed pattern 111 in the non-grafted part 110b corresponds to the imprint left by a topographic pattern 121 of the mould 120. The pressure exerted and the height of the topographic patterns 121 are such that the patterns 121 of the mould 120 do not come into contact with the grafted part 110a of the polymer layer 110. A residual layer 110c of the functionalisation polymer 110 may then be observed at the bottom of the recessed patterns 111. The recessed patterns 111 preferably have a depth comprised between 5 nm and 20 nm, whereas the non-grafted part 110b measures between 10 nm and 50 nm thickness.

During the printing step S13, the principle of conservation of local volume is preferably applied: the non-grafted polymer material is just displaced and is not reduced in quantity. To do so, the thickness of the polymer layer 110 is selected such that the volume of the non-grafted part 110b is greater than the volume to fill in the cavities of the mould 120 (i.e. on each side of the topographic patterns 121).

In this first embodiment of the method, the printing is advantageously thermally enhanced, by heating the substrate and/or the mould to a temperature above the glass transition temperature of the functionalisation polymer 110, generally comprised between 100° C. and 120° C. for copolymers based on PMMA and PS. Then, a pressure comprised between 1 bar (0.1 MPa) and 100 bars (10 MPa) is applied on the rear face of the mould 120 for several minutes. Finally, the mould-substrate assembly is cooled to a temperature below the glass transition temperature of the polymer material, before the mould 120 is separated from the substrate 100.

The step S14 that follows (cf. FIG. 1D) consists in transferring the recessed patterns 111 formed in the non-grafted part 110b to the grafted part 110a of the polymer layer 110, and to do so until they emerge on the upper face of the substrate 100. In other words, during this step S14, the residual layer 110c of polymer situated at the bottom of the recessed patterns 111 is removed.

This transfer is obtained by etching the grafted part 110a of the polymer layer through the non-grafted part 110b, which thus serves as etching mask. Since the thickness of the grafted part 110a is well below that of the non-grafted part 110b, the residual layer 110c may be removed entirely while conserving a thickness of non-grafted polymer on the grafted part 110a.

A method of dry etching, of plasma type, for example based on oxygen and chlorinated and/or fluorinated gas, may be employed at the transfer step S14. This type of etching is strongly anisotropic and makes it possible to obtain recessed patterns 111' in the grafted part 110a of same width as the recessed patterns 111 in the non-grafted part 110b. In so far as it is covered by the non-grafted part 110b throughout step S14, the grafted part 110a of the polymer layer 110 is not exposed to the plasma and thus does not risk being altered by it.

Thus, in this first embodiment, the non-grafted part 110b constitutes a protective layer for the grafted part 110a of the functionalisation polymer. The grafted part 110a being intended to form the functionalisation layer of the substrate 100, this makes it possible to preserve its physical and chemical properties, such as the surface roughness and the chemical affinity. This protection acts not just during the step of printing of the patterns but also during the later step of transferring these patterns (the actual step of patterning the functionalisation layer).

Figure 1D:
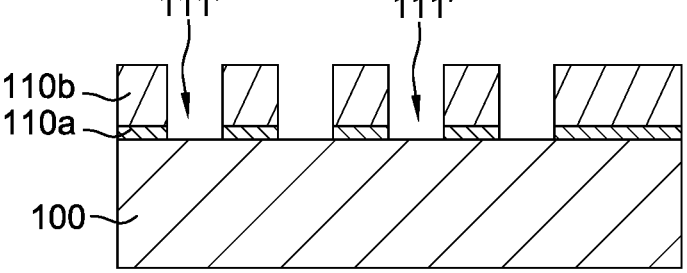
Figure 1E:
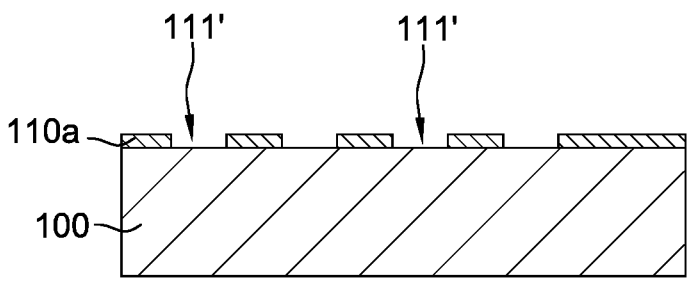

The non-grafted part 110b of the polymer layer 110 may be also qualified as sacrificial layer since it is removed, during a step S15 represented by FIG. 1E, to uncover the grafted part 110a. A functionalisation layer, which is patterned, that is to say which exposes one or more areas of the upper face of the substrate 100 (in the recessed patterns 111'), is thereby obtained. This removal is carried out by wet etching, in order not to alter the properties of the functionalisation layer. Preferably, a solvent such as PGMEA is used to dissolve the non-grafted part 110b of the functionalisation polymer.

A specificity of this first embodiment of the functionalisation method is that the patterns are directly printed in the non-grafted part 110b of the polymer layer 110. This makes it possible to minimise the number of steps of the functionalisation method, as well as the number of materials used.

FIGS. 2A to 2F represent the steps S21 to S26 of a functionalisation method according to a second embodiment of the invention.

Figure 2A:
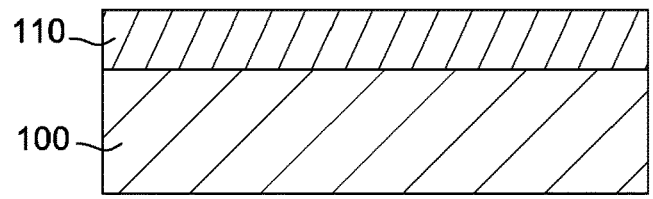
FIGS. 2A to 2F represent the steps of a functionalisation method according to a second embodiment of the invention.
Figure 2B:
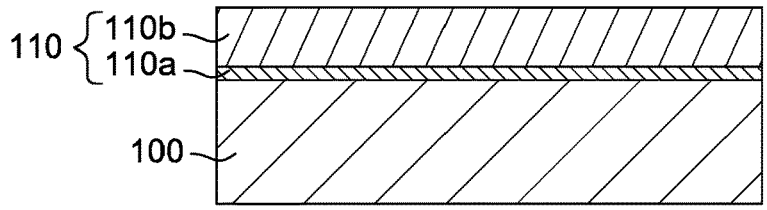

The two first steps S21 and S22, illustrated by FIGS. 2A and 2B respectively, are identical to the steps S11 and S12 described previously in relation with FIGS. 1A and 1B. Thus, a layer of a functionalisation polymer 110 is deposited on the substrate 100 during step S21, then a part 110a of this layer is grafted onto the substrate 100 during step S22. As previously, a non-grafted part 110b of the polymer layer 110 covers the grafted part 110a.

Figure 2C:
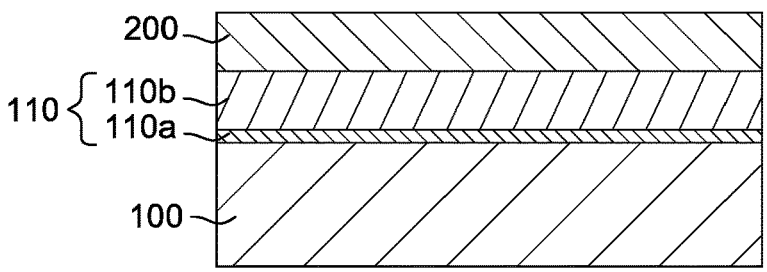

With reference to FIG. 2C, the functionalisation method next comprises a step S23 consisting in depositing a layer made of a printable polymer material 200 on the non-grafted part 110b of the polymer layer 110. This printable polymer 200 is distinct from the functionalisation polymer 110. The printable polymer 200 is preferably a thermoplastic resin, for example based on PS, PMMA or cyclic olefin copolymer (COC), a thermosetting resin (e.g. acrylic based resin comprising a heat initiated cross-linking agent) or a photo-polymerisable resin (e.g. epoxy or acrylate based resin comprising one or more photo-initiators).

Figure 2D:
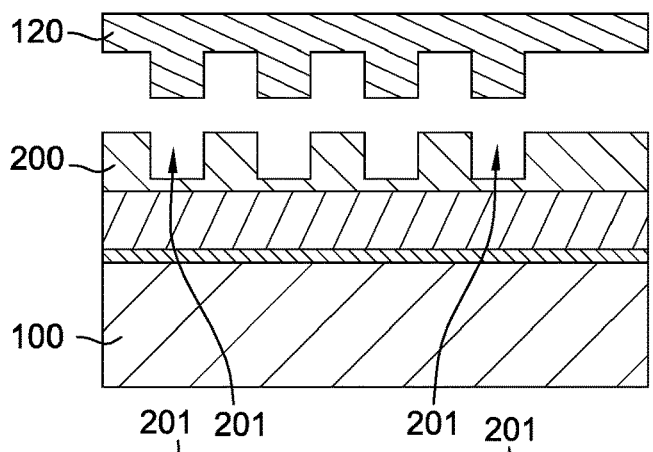
Figure 2E:
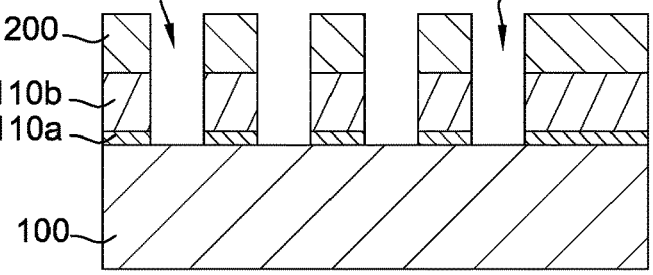

Then, at step S24 of FIG. 2D, patterns 201 are printed in the layer of printable polymer 200 using a mould 120. When the printable polymer 200 is a thermoplastic or thermosetting resin, the printing is thermally enhanced. The printable polymer 200 is heated to a cross-linking temperature (in the case of a thermosetting resin) or to a glass transition temperature (in the case of a thermoplastic resin). This cross-linking or glass transition temperature (depending on the case) is advantageously lower than the glass transition temperature of the functionalisation polymer 110 (for example a random copolymer). This thus avoids making the functionalisation polymer 110 deformable and, consequently, the risk of mixing the polymers.

In an alternative embodiment of step S24, when the printable polymer 200 is a photo-polymerisable resin, the printing is ultraviolet (UV) enhanced. The layer of printable polymer 200 is exposed to UV rays while the mould 120 is pressed against the substrate 100. The mould 120 is then transparent to the UV rays. The UV-enhanced printing may be carried out at room temperature (i.e. 25° C.) or at a temperature comprised between 40° C. and 70° C. (and thus at a temperature below the glass transition temperature of the functionalisation polymer 110). The pressure applied is preferably comprised between 1 bar (0.1 MPa) and 50 bars (5 MPa). The resin is thereby exposed for several minutes, until its curing is obtained. Finally, the mould 120 is separated from the cured resin layer.

Using a printable polymer material distinct from the functionalisation polymer makes it possible to optimise the step S24 of printing patterns, because this material may then be chosen for its shaping properties (by printing), independently of the choice of the functionalisation polymer. This differentiation of the materials also offers more possibilities for the choice of the functionalisation polymer. Indeed, the functionalisation polymer does not need to be printable in this second embodiment.

The functionalisation method is continued by a step S25 of transferring the patterns 201 (FIG. 2E), similar to that described with reference to FIG. 1D. The patterns 201 printed in the layer of printable polymer 200 are transferred into the non-grafted part 110b, then into the grafted part 110a of the polymer layer 110 until the substrate is reached 100. This transfer is preferably obtained by plasma etching through the layer of printable polymer 200 and the non-grafted part 110b.

Thus, in this second embodiment of the functionalisation method, the sacrificial layer that protects the grafted part 110a during the transfer of the patterns (201) comprises a first sub-layer corresponding to the non-grafted part 110b of the polymer layer 110 and a second sub-layer constituted of the printable polymer 200.

Figure 2F:
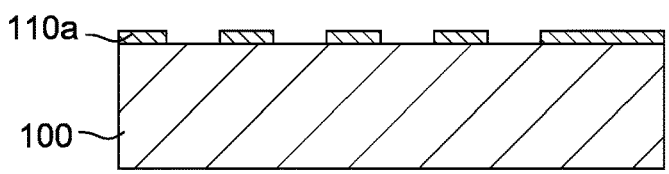

Finally, during a last step S26 illustrated by FIG. 2F, the non-grafted part 110b of the polymer layer 110 is removed by means of a solvent, which makes it possible to remove simultaneously the layer of printable polymer 200 (either by lift-off effect, when it is a thermosetting or photo-polymerisable material, or by the effect of the solvent itself, when it is a thermoplastic material). Alternatively, the layer of printable polymer 200 is firstly removed by dry etching, for example by means of a plasma (e.g. $O_2$, $Cl_2$, $C_4F_8$ and combinations thereof), then the non-grafted part 110b of the polymer layer 110 is removed by wet etching (preferably by means of a solvent). This last step makes it possible to uncover the non-grafted part 110a of the functionalisation polymer, which covers the substrate 100 except in the areas corresponding to the location of the printed patterns 201.

FIGS. 3A to 3F represent the successive steps S31 to S36 of a functionalisation method according to a third embodiment of the invention.

Figure 3A:
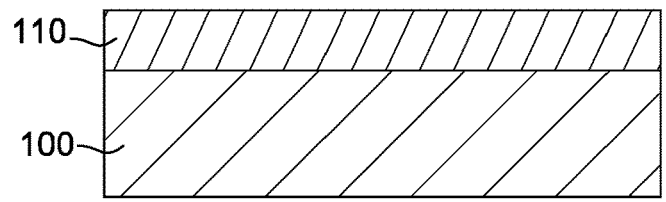
FIGS. 3A to 3F represent the steps of a functionalisation method according to a third embodiment of the invention.
Figure 3B:
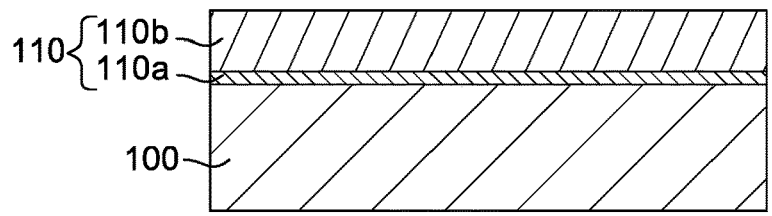
Figure 3C:
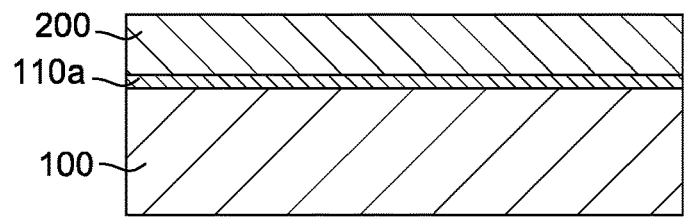
Figure 3D:
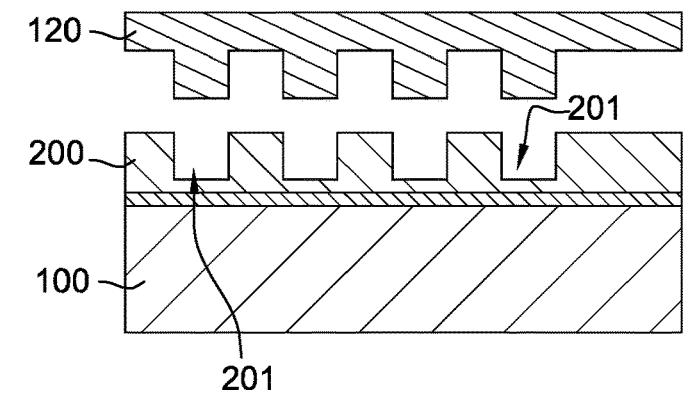
Figure 3E:
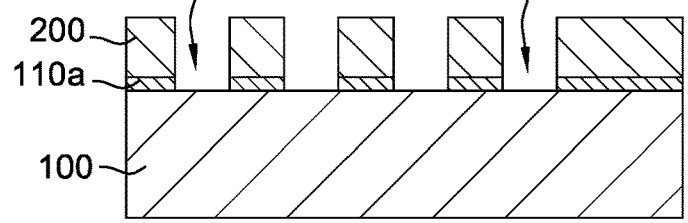
Figure 3F:
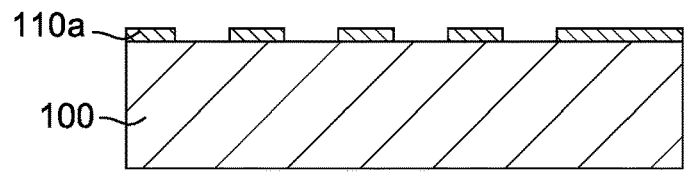

This third embodiment differs from that of FIGS. 2A-2F in that the non-grafted part 110b of the polymer layer 110 is removed before the deposition of the layer of printable polymer 200, during a step S33 (FIG. 3C).

Thus, the protective (and sacrificial) layer that covers the grafted part 110a of the functionalisation polymer is only comprised of the layer of printable polymer 200. This thus avoids the superimposition of two polymer materials—the non-grafted functionalisation polymer and the printable polymer—and thus problems of compatibility that result from this superimposition.

In addition to the benefit provided by the printable material 200 (i.e. simplification of the printing step), this third embodiment offers the greatest freedom with regard to the choice of polymers. Indeed, the functionalisation polymer is, once grafted, chemically and thermally stable and thus does not limit the choice of printable polymer 200 deposited thereon.

The other steps of the method, that is to say the step S31 of depositing the functionalisation polymer 110, the grafting step S32, the step S34 of printing patterns 201 in the layer of printable polymer 200, the step S35 of transferring patterns 201 and the step S35 of removing the protective layer, are implemented as described previously in relation with FIGS. 2A-2B, 2D-2F (steps S21-S22, S24-S26 respectively). In particular, a solvent such as that used to remove the non-grafted part 110b (e.g. PGMEA) or another aprotic polar solvent is advantageously used in step S36 to remove the protective layer made of printable polymer 200.

The functionalised substrate obtained at the end of any of the above methods (cf. FIGS. 1E, 2F and 3F) may be used in a method of directed self-assembly (DSA) of block copolymer and more particularly in a chemo-epitaxy method, in order to generate patterns of very high resolution and density. This chemo-epitaxy method comprises a step of depositing a block copolymer on the surface of the functionalised substrate (on the grafted part 110a of the functionalisation polymer) and a step of organising the blocks of the copolymer, for example by annealing.

The block copolymer may notably be selected from the following:
   PS-b-PMMA: polystyrene-block-polymethylmethacrylate;
   PS-b-PLA: polystyrene-block-polylactic acid;
   PS-b-PEO: polystyrene-block-polyethylene oxide;
   PS-b-PDMS: polystyrene-block-polydimethylsiloxane;
   PS-b-PMMA-b-PEO: polystyrene-block-polymethylmethacrylate-block-polyethylene oxide;
   PS-b-P2VP: polystyrene-block-poly(2vinylpyridine).

The functionalisation polymer 110 may be a random copolymer composed of the same blocks of monomer as the block copolymers listed above (PS-r-PMMA, PS-r-PLA, PS-r-PEO, etc.), a homopolymer constituted of one of these monomers (PS, PMMA, PLA, etc.) or any other graftable polymer having the desired affinity. Materials including PS, PMMA and/or PDMS have the particularity of being able to be thermally printed (cf. FIG. 1C).

A fourth embodiment of the functionalisation method according to the invention will now be described with reference to FIGS. 4A to 4E. This is derived from the first embodiment, in which the patterns are printed directly in a non-grafted part of the functionalisation polymer.

Figure 4A:
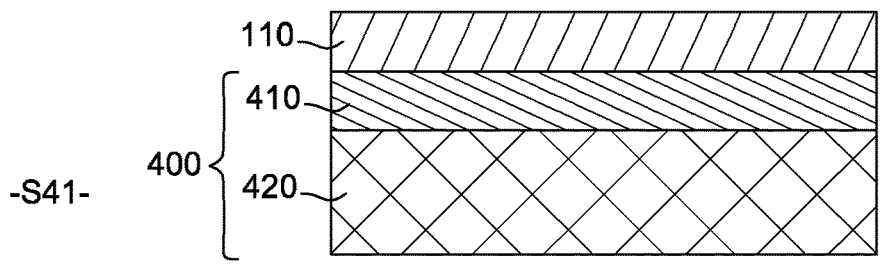
FIGS. 4A to 4E represent the steps of a functionalisation method according to a fourth embodiment of the invention.
Figure 4B:
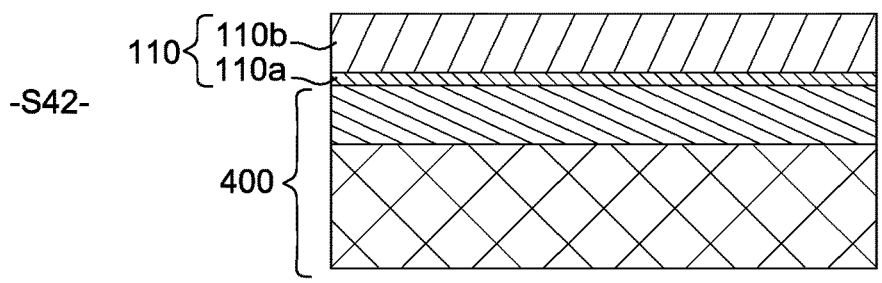
Figure 4C:
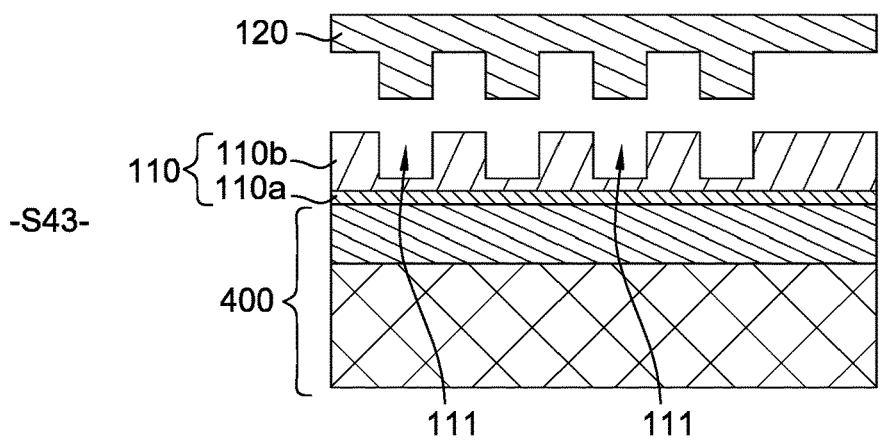
Figure 4D:
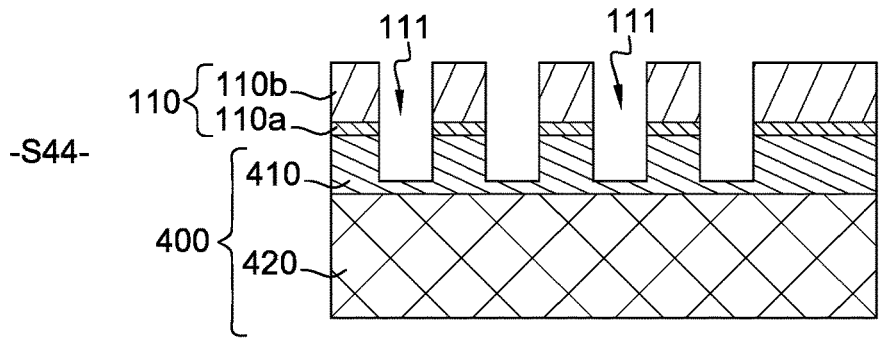
Figure 4E:
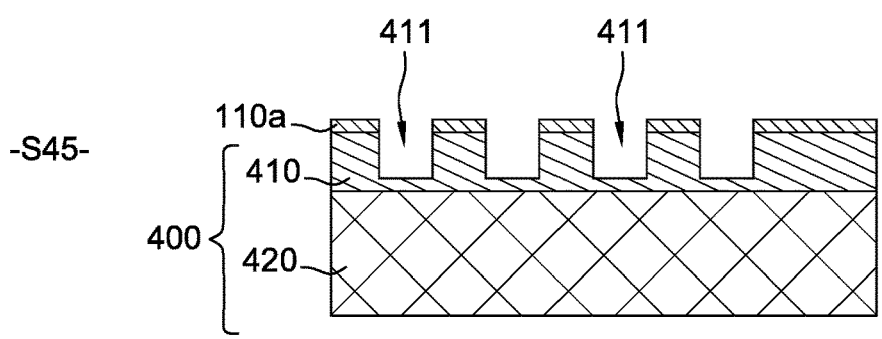

The functionalisation method of FIGS. 4A to 4E thus comprises a step S41 consisting in depositing a layer of a first functionalisation polymer 110 on a substrate 400 (cf. FIG. 4A), a step of grafting S42 a part 110a of this layer onto the surface of the substrate 400 (FIG. 4B), a step S43 of printing patterns 111 in the non-grafted part 110b of the layer of the first functionalisation material 110 (FIG. 4C), a step of transferring patterns 111 into the grafted part 110a (FIG. 4D), and finally a step of removing the non-grafted part 110b by wet etching (FIG. 4E).

The specificities of this fourth embodiment of the functionalisation method are two in number.

Firstly, the substrate 400 to functionalise comprises a superficial layer 410 made of a second functionalisation polymer material. This second functionalisation polymer has a chemical affinity different to that of the first functionalisation polymer 110, deposited on the substrate 400 at step S41 of FIG. 4A. Thus, when the first functionalisation polymer 110 is neutral with respect to the block copolymer, the second functionalisation polymer has a preferential affinity for one of the blocks of the copolymer. The second functionalisation polymer is preferably a homopolymer, such as polystyrene (PS). The superficial layer 410, of thickness comprised between 1 nm and 500 nm, is arranged on a support layer 420 of the substrate 400, for example made of silicon.

Secondly, the patterns 111 printed in the non-grafted part 110b are transferred beyond the grafted part 110a during the plasma etching step S44, to form recessed patterns 411 in at least one part of the superficial layer 410. Preferably, the recessed patterns 411 have a depth comprised between 5 nm and 20 nm. They thus do not reach the silicon support layer 420.

Thus, at the end of this functionalisation method (cf. FIG. 4E), not only a chemical contrast is obtained on the surface of the substrate 400, formed by the alternation between the layer of the first functionalisation polymer 110 and the superficial layer 410 made of the second functionalisation polymer, but also a topographic contrast is obtained due to the recessed patterns 411 formed in the superficial layer 410.

Such a functionalised substrate may notably serve in a hybrid method combining chemo-epitaxy and grapho-epitaxy. The recessed patterns 411 constitute in fact an assembly guide that will be filled by the block copolymer and which will allow, together with the functionalisation layer (110a), the organisation of the copolymer blocks to be controlled.

In an alternative embodiment of step S44 (FIG. 4D), the recessed patterns 411 formed in the superficial layer 410 emerge on the upper face of the support layer 420 and the material of this support layer 420 (for example $SiO_2$ which is PMMA-affine) has a chemical affinity with respect to the block copolymer different to those of the first and second functionalisation polymers. This makes it possible to obtain an assembly guide having multiple chemical affinities: a first chemical affinity at the level of the upper face of the guide (grafted part 110a), a second chemical affinity at the level of the side walls of the guiding patterns 411 (superficial layer 410) and a third chemical affinity at the bottom of the guiding patterns 411 (support layer 420).

The formation of an assembly guide in the superficial layer 410 of the substrate 400 is also compatible with the second and third embodiments of the functionalisation method, represented respectively by FIGS. 2A-2F and 3A-3F. Thus, to print the patterns, it is also possible to use a specific printable polymer material, in superimposition (FIGS. 2A-2F) or in substitution (FIGS. 3A-3F) of the non-grafted part of the first functionalisation polymer 110.

Of course, the functionalisation method according to the invention is not limited to the embodiments described with reference to FIGS. 1 to 4 and numerous alternatives and modifications will become clear to those skilled in the art. In particular, the first functionalisation polymer (110) and the second functionalisation polymer (410) could have other compositions than those described previously. Similarly, other block copolymers could be used.

In an alternative embodiment of the method, the grafting of the polymer layer onto the substrate is obtained during the printing step. Indeed, since the printing is thermally enhanced, the whole of the polymer layer is heated and a non-printed part may be grafted onto the substrate. In other words, the grafting step S12, S22, or S42 and the printing step S13, S24, or S43 may be accomplished simultaneously, rather than successively.

The invention claimed is:

1. Method for functionalising a substrate intended for the self-assembly of a block copolymer, comprising:
   depositing on a surface of the substrate a layer of a first polymer material, the first polymer material having a first chemical affinity with respect to the block copolymer;
   grafting a part only of the first polymer material layer onto the surface of the substrate to obtain a modified first polymer material layer that includes a grafted part of the first polymer material layer onto the surface of the substrate and a non-grafted part of the first polymer material layer arranged on the grafted part of the first polymer material layer;
   printing, using a mould, patterns in a sacrificial layer arranged above the grafted part of the first polymer material layer, the sacrificial layer comprising the non-grafted part of the first polymer material layer;
   transferring the patterns of the sacrificial layer into the grafted part of the first polymer material layer, until the substrate is reached; and
   after said transferring, removing at least the non-grafted part of the first polymer material layer by wet etching, so as to uncover the grafted part of the first polymer material layer.

2. The method according to claim 1, wherein the sacrificial layer comprises a first sub-layer comprised of a non-grafted part of the first polymer material layer and a second sub-layer made of a printable polymer material distinct from the first polymer material.

3. The method according to claim 2, comprising depositing the sacrificial layer made of printable polymer material on the non-grafted part of the first polymer material layer.

4. The method according to claim 2, wherein the printable polymer material is a thermoplastic resin, a thermosetting resin or a photo-polymerisable resin.

5. The method according to claim 1, wherein the substrate comprises a superficial layer made of a second polymer material having a second chemical affinity with respect to the block copolymer and wherein the patterns of the sacrificial layer are further transferred into the superficial layer.

6. The method according to claim 5, wherein the second polymer material has a preferential affinity for one of the blocks of the block copolymer.

7. The method according to claim 1, wherein the non-grafted part of the first polymer material layer is removed by means of a solvent.

8. The method according to claim 1, wherein the first polymer material is neutral with respect to the blocks of the block copolymer.

9. The method according to claim 1, wherein the first polymer material layer is formed of a random copolymer, a homopolymer or a self-assembled monolayer.

10. The method according to claim 1, wherein the patterns are printed in the sacrificial layer by thermal printing or by UV-enhanced printing.

11. The method according to claim 1, wherein the grafting of the first polymer material layer onto the surface of the substrate and the printing of the patterns are carried out simultaneously.

12. Chemo-epitaxy method comprising:
preparing a substrate functionalised using a method according to claim 1;
depositing a block copolymer on the surface of the functionalised substrate; and
assembling the block copolymer.

* * * * *